United States Patent [19]

Kelly

[11] Patent Number: 4,554,457

[45] Date of Patent: Nov. 19, 1985

[54] MAGNETIC LENS TO ROTATE TRANSVERSE PARTICLE MOMENTA

[75] Inventor: Michael A. Kelly, Portola Valley, Calif.

[73] Assignee: Surface Science Laboratories, Inc., Mountain View, Calif.

[21] Appl. No.: 512,418

[22] Filed: Jul. 8, 1983

[51] Int. Cl.[4] ............................................. H01J 37/26
[52] U.S. Cl. ......................................... 250/396 ML
[58] Field of Search ............... 250/396 ML, 399, 305, 250/306, 281, 397, 396 R

[56] References Cited

U.S. PATENT DOCUMENTS

| | | | |
|---|---|---|---|
| 3,435,207 | 3/1969 | Baldwin | 250/287 |
| 3,474,245 | 10/1969 | Kimura et al. | 250/397 |
| 3,482,091 | 12/1969 | Baldwin | 250/396 R |
| 3,822,382 | 7/1974 | Koike | 250/305 |
| 3,986,025 | 10/1976 | Fujiwara et al. | 250/306 |
| 4,255,656 | 3/1981 | Barrie et al. | 250/305 |
| 4,486,659 | 12/1984 | Turner | 250/306 |

Primary Examiner—Bruce C. Anderson
Assistant Examiner—Paul A. Guss
Attorney, Agent, or Firm—Harry E. Aine

[57] ABSTRACT

A magnetic rotator lens for rotating the momenta of particles transverse to the direction of the beam is disclosed. The rotator lens includes a solenoid axially aligned with the beam and employs a magnetic permeable flux return structure surrounding the solenoid. The flux return structure includes beam entrance and exit plates with magnetic permeable and charged particle permeable portions forming the beam entrance and exit ports of the magnetic lens. In a typical example, the beam entrance magnetic permeable and beam permeable portion of the pole piece structure is formed by a grid of magnetic permeable members. The magnetic permeable and beam permeable portions of the pole structures terminate the axial magnetic field without introducing any substantial transverse components to the magnetic field which would otherwise produce undesired rotation of the beam shape. The magnetic rotator lens is employed to advantage in a surface analyzer for focusing a ribbon shaped beam of photoelectrons through the entrance slit of a spherical electrostatic analyzer.

6 Claims, 4 Drawing Figures

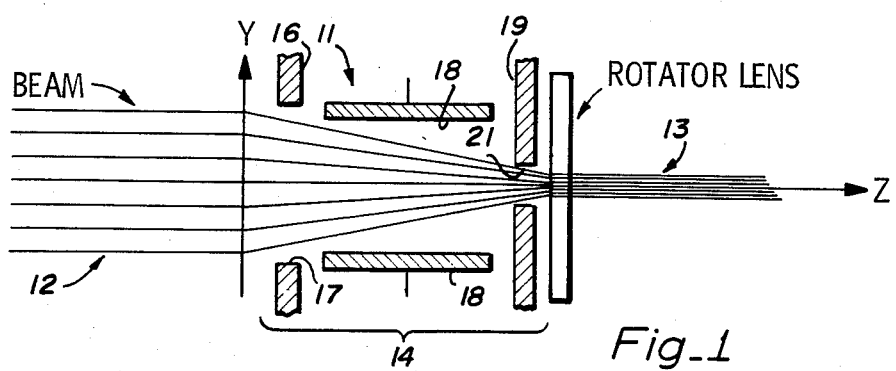
Fig_1
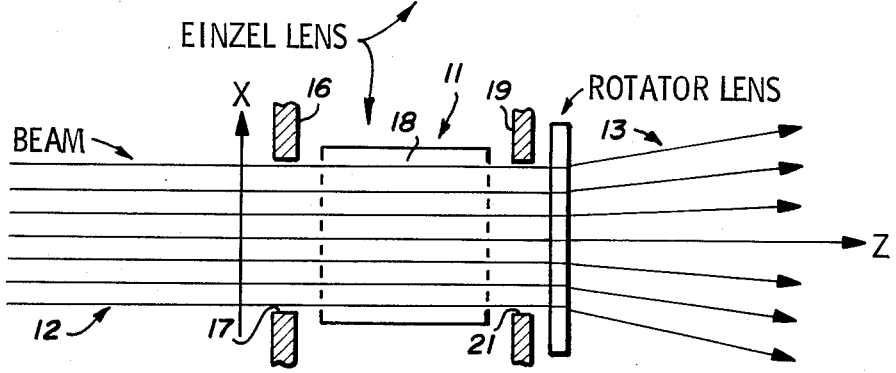
Fig_2
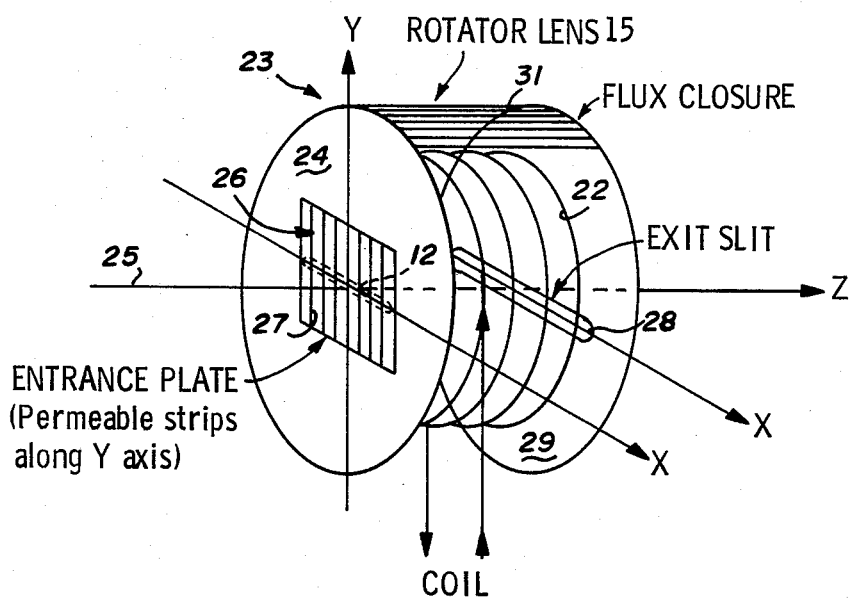
Fig_3

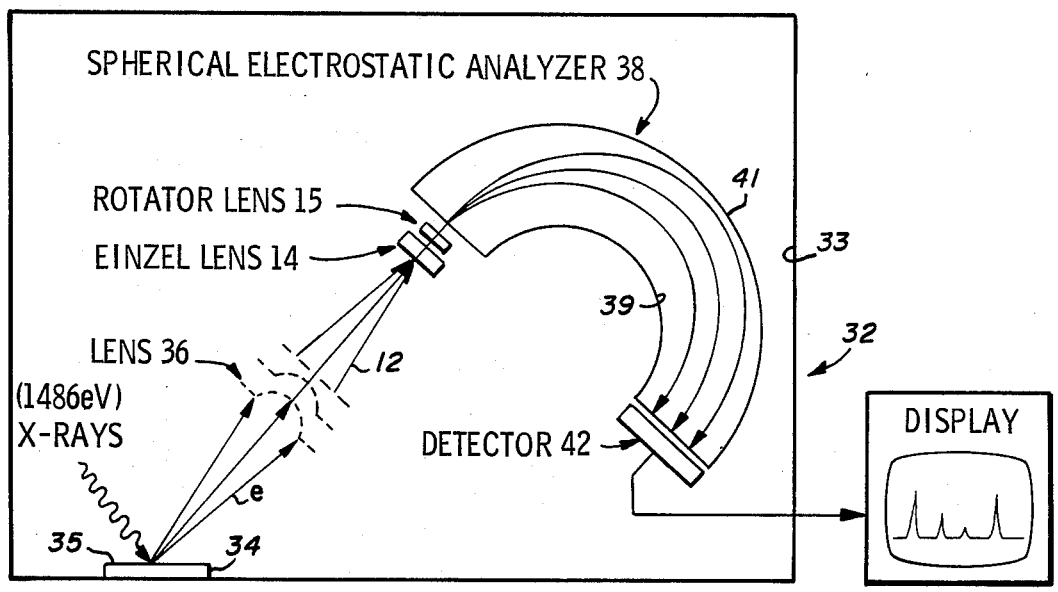
Fig_4

MAGNETIC LENS TO ROTATE TRANSVERSE PARTICLE MOMENTA

BACKGROUND OF THE INVENTION

The present invention relates in general to magnetic lenses for rotating transverse particle momenta of a beam of charged particles and to surface analyzers using same.

DESCRIPTION OF THE PRIOR ART

Heretofore, surface analyzers utilizing energy analysis of photo-emitted electrons from a surface under analysis have employed an electrostatic Einzel lens for focusing a beam of the photoelectrons through a slit into a spherical electrostatic analyzer. The problem with such an arrangement is that when the solid beam is focused into a ribbon beam for entering the spherical electrostatic analyzer, a substantial transverse momenta, transverse to the plane of the beam, is imparted to the electrons forming the ribbon beam to be analyzed. This transverse momenta tends to degrade the resolution of the output energy spectrum obtained from the output of the spherical electrostatic analyzer.

It would be desirable to obtain a focusing scheme for focusing the solid beam of electrons into a ribbon beam for injection into the spherical analyzer which did not introduce a substantial transverse momenta directed out of the plane of the ribbon shaped beam. If the transverse momenta could be directed within the plane of the ribbon shaped beam, the spherical electrostatic analyzer performance would not be substantially degraded.

SUMMARY OF THE PRESENT INVENTION

The principal object of the present invention is the provision of an improved magnetic lens for rotating the transverse particle momenta of charged particles within a beam and to improve the resolution of a surface analyzer using such a lens.

In one feature of the present invention, a magnetic lens is provided employing substantially a pure axial magnetic field for rotating the transverse momenta of the particles into the plane of the beam so as to substantially reduce the transverse momenta of the particles in a direction normal to the plane of the beam.

In another feature of the present invention, the magnetic lens employs an entrance magnetic permeable and charged particle permeable pole structure which greatly reduces the transverse components of the axial magnetic field utilized for rotating the transverse particle momenta.

In another feature of the present invention, the beam exit pole structure of the magnetic lens includes a slit through which the beam exits, such slit serving to intercept the axial magnetic field of the lens without introducing substantial transverse magnetic field components and while allowing the ribbon shaped beam to exit the lens.

In another feature of the present invention, a surface analyzer utilizing a beam of photoelectrons emitted from the surface under analysis employs the magnetic rotator lens for rotating the transverse particle momenta into the plane of a ribbon shaped beam fed into a spherical electrostatic energy analyzer, whereby improved resolution is obtained.

Other features and advantages of the present invention will become apparent upon a purusal of the following specification taken in connection with the accompanying drawings wherein:

DESCRIPTION OF THE DRAWINGS

FIG. 1 is a longitudinal sectional view, partly in block diagram form, of a lens system employed for focusing a solid beam into a ribbon beam which is thence fed into a spherical electrostatic analyzer in accordance with provisions of the present invention, FIG. 2 is a view similar to that of FIG. 1 taken transverse to the plane of the view of FIG. 1, FIG. 3 is a schematic perspective view of a magnetic rotator lens incorporating features of the present invention, and FIG. 4 is a schematic line diagram, partly in block diagram form, of a surface analyzer incorporating features of the present invention.

DESCRIPTION OF THE PREFERRED EMBODIMENTS

Referring now to FIGS. 1 and 2, there is shown an electron lens system 11 incorporating features of the present invention. More particularly, a solid beam 12 of charged particles, such as ions or electrons, and of generally circular cross-section is fed into the lens system 11. The beam exits the lens system 11 as a ribbon shaped beam 13 with the transverse momenta of the beam particles produced by the compression of the beam from the circular cross-section into a ribbon being directed generally in the plane of the ribbon. This type of a lens system 11 is particularly well suited for use in a surface analyzer of the type wherein photoelectrons emitted from the surface under analysis are focused through a slot into a spherical electrostatic analyzer. This type of system will be more fully described below with regard to FIG. 4.

The lens system 11 includes an electrostatic Einzel lens 14 for compressing the solid beam 12 into the ribbon shaped beam followed by a magnetic rotator lens 15 which rotates the transverse particle momenta produced by the Einzel lens into the plane of the ribbon shaped beam 13.

The Einzel lens 14 includes a beam entrance electrode 16 having a generally circular beam entrance hole 17 axially aligned with the beam path. A pair of rectangular plate electrodes 18 are disposed on opposite sides of the beam, such electrodes being spaced apart in the direction of compression of the beam. The Einzel lens 14 includes a beam exit electrode 19 having a beam exit slit 21 axially aligned with the compressed ribbon shaped beam. The rotator lens 15 converts the transverse particle momenta produced by the Einzel lens into transverse momenta within the plane of the ribbon shaped beam.

Referring now to FIG. 3, the magnetic rotator lens 15 is shown in greater detail. More particularly, the rotator lens 15 includes a magnetic coil or solenoid 22 formed by a coil of wire and energized with current to form a solenoid axially aligned with the beam path, i.e., the Z direction. A magnetically permeable structure encloses the solenoid 22 for shaping the magnetic field in the region of the beam. The magnetic flux return structure 23 includes a beam entrance plate 24 of magnetically permeable material, such as mu-metal. The beam entrance pole plate 24 is transversely disposed to the beam path 25 and includes a magnetically permeable and charged particle permeable portion 26 through which the beam passes in entering the rotator lens 15.

The beam permeable portion 26 of the entrance plate 24 is perferably formed by a grid of magnetically permeable members 27 such as strips of mu-metal 27, such strips being directed perpendicular to the plane of the ribbon shaped beam 12 entering the lens 15. These ribbon shaped members 27 allow a continuation of the magnetic pole structure 24 in such a manner as to substantially minimize any transverse magnetic field component in the axial magnetic field produced by the coil or solenoid 22 and within the beam. By minimizing any transverse magnetic field components of the magnetic lens 15, the ribbon shape of the beam can be maintained without rotation thereof in passing through the lens 15. However, the axial magnetic field component of the lens does interact with the transverse momenta components of the ribbon shaped beam which are directed perpendicular to the plane of the beam so as to rotate those transverse momenta components 90 degrees and back into the plane of the ribbon shaped beam which exits through an exit slit 28 in the beam exit pole plate 29 of the lens 15.

The pole structures 24 and 29 are interconnected by a cylindrical portion 31 of magnetically permeable material disposed surrounding the coil 22. The beam exit slit 28 forms the beam permeable portion of the magnetic permeable beam exit pole structure 29. The slit 28 may be employed because the momenta of the beam particles which is transverse to the axis of the beam has been transformed by the lens 15 into the plane of the ribbon shaped beam at the exit slit 28.

In a typical physical realization of the lens 15, the axial magnetic field strength is 50 gauss, the distance between pole plates is 1 cm, and the beam particles have an energy of 100 eV.

As an alternative to the grid of parallel strips 27, a cross-screen of magnetic permeable members may also be employed for the electron beam permeable portions of both the beam entrance and beam exit pole plates 24 and 29 respectively.

Referring now to FIG. 4, there is shown a surface analyzer 32 incorporating features of the present invention. Surface analyzer 32 includes an evacuated chamber 33 evacuated to a very low pressure so as not to interfere with electron trajectories within the chamber 33. A sample of material 34, the surface 35 of which is to be analyzed, is disposed within the chamber 33. X-rays derived from an X-ray source within the chamber are directed onto the surface 35 of the sample 34 to be analyzed. In a typical example, the X-rays have an energy of 1486 electrons volts.

The impinging X-rays produce photoelectrons emitted from the surface 35. The photoelectrons have various energies depending upon the element which is bombarded by the X-rays and which produces the photoelectron. In a typical example, oxygen on the surface and bombarded by the X-rays of the aforecited energy, emits photoelectrons of 1,000 electron volts. Similarly, carbon emits at 1200 electron volts, fluorine emits at 800 electron volts and sodium emits at 400 electron volts.

The emitted electrons define an electron source. An electrostatic lens 36 is disposed for gathering and focusing the emitted electrons as a beam of generally circular cross-section into the input aperture of the Einzel lens 14. As previously described with regard to FIGS. 1-3, the Einzel lens 14 compresses the solid circular beam 12 into a ribbon shaped beam which is thence fed into the input aperture 26 of the magnetic rotator lens 15. The rotator lens 15 rotates the transverse momenta of the charged particle beam from the plane generally transverse to the plane of the ribbon shaped beam into the plane of the ribbon shaped beam which is thence fed through a beam entrance slit 37 of a spherical electrostatic analyzer 38.

The spherical electrostatic analyzer 38 has an inside spherical electrode 39 operating at a first potential $V_1$ and an outside spherical electrode 41 operating at a second potential $V_2$ which is more negative than the potential of $V_1$. The result is that the electrons entering the slot 37 are caused to follow trajectories having different radii of curvature depending upon their energies in electron volts. In this manner, the analyzer 38 separates the electrons radially in accordance with their energies at a detector 42 at the output of the spherical electrostatic analyzer 38.

The detector 42 is a positional detector and detects the electrons incidence thereon as a function of the radial position of the electrons. The output of the detector 42 is fed to a display 42 which displays the integrated peak amplitude of the electron image formed on the detector 42. Thus, there is a spectral output display displaying the output energies of the photoelectrons emitted from the surface 35. Each of the peaks (lines) of the display corresponds to a different element found on the surface 35. In this manner the surface 35 of the sample is analyzed for its constituents.

The rotator lens 15 is particularly useful in this combination because it essentially eliminates transverse momenta of the particles in the direction transverse to the ribbon shaped beam entering the analyzer 38. As a result, the spherical analyzer can properly analyze essentially all of the electrons entering its entrance slit 37 because of its generally spherical shape. That is, electrons having different transverse momenta in the plane of the ribbon shaped beam can follow great circle trajectories around the spherical analyzer electrodes to the detector 42. In this manner, essentially all of the electrons are properly segregated in accordance with their energies at the detector 42. This would not be the case if the ribbon shaped beam entering the entrance slit 37 had substantial momenta transverse to the plane of the ribbon shaped beam. A typical energy for the beam entering the slit 37 is 100 electron volts.

What is claimed is:

1. A magnetic lens for rotating the transverse particle momenta of a beam of charged particles passing therethrough while preserving the cross-sectional shape of the beam including:

magnet means for generating a magnetic field component axially directed of and within the beam of charged particles;

flux return means of a magnetically permeable material disposed surrounding said magnetic means for intercepting said axially directed components of said magnetic field and for returning same around said magnet means;

said flux return means including beam entrance and beam exit pole structures axially spaced apart along the beam path at opposite ends of said magnet means, and said beam entrance pole structure including a beam permeable portion of magnetic permeable material for shaping the axial magnetic field so as to minimize transverse magnetic components thereof and through which said beam of charged particles enters the lens.

2. The apparatus of claim 1 wherein said beam permeable portion of said beam entrance pole structure comprises an array of parallel strips of magnetic permeable material, said parallel strips being directed parallel to the predominant transverse momenta of the beam particles.

3. The apparatus of claim 2 wherein the particle beam has a ribbon shape entering the magnetic lens with the plane of the ribbon being transverse to the direction of elongation of said magnetic permeable strips.

4. The apparatus of claim 1 wherein said beam exit pole structure includes a slot through which the beam exits the magnetic lens.

5. The apparatus of claim 1 wherein the beam is ribbon shaped entering the magnetic lens with predominant transverse particle momenta being directed transversely to the plane of the ribbon, and wherein said beam permeable portion of said beam entrance pole structure comprises an array of parallel strips of material, said parallel strips being elongated in a direction transverse to the plane of the ribbon shaped beam.

6. The apparatus of claim 1 including an evacuated chamber enclosing the magnetic lens; means for bombarding the surface of a sample to be disposed within said chamber to produce emission of electrons from the bombarded surface, analyzer means within said chamber for analyzing the energy of the electrons emitted from said bombarded surface; and wherein said magnetic lens is positioned for directing the electrons emitted from said bombarded surface into said analyzer means.

* * * * *